United States Patent
Hau et al.

(10) Patent No.: US 7,554,407 B2
(45) Date of Patent: Jun. 30, 2009

(54) MULTI-MODE POWER AMPLIFIER WITH LOW GAIN VARIATION OVER TEMPERATURE

(75) Inventors: Gary Hau, Merrimack, NH (US); Jeffrey R. Turpel, Ipswich, MA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 302 days.

(21) Appl. No.: 11/683,128

(22) Filed: Mar. 7, 2007

(65) Prior Publication Data

US 2008/0218270 A1    Sep. 11, 2008

(51) Int. Cl.
*H03F 3/04* (2006.01)
(52) U.S. Cl. ............... 330/289; 455/73; 330/124 R; 330/124 D; 330/278
(58) Field of Classification Search .......... 330/289, 330/124 R, 124 D, 278; 455/73
See application file for complete search history.

(56) References Cited

U.S. PATENT DOCUMENTS

| | | | |
|---|---|---|---|
| 5,051,706 A | 9/1991 | Zushi | |
| 6,791,407 B2 | 9/2004 | Grebennikov et al. | |
| 6,937,102 B2 | 8/2005 | Lopez et al. | |
| 6,946,911 B2 | 9/2005 | Yang et al. | |
| 7,342,455 B2 * | 3/2008 | Behzad et al. | ............... 330/289 |

OTHER PUBLICATIONS

Miceli, Andrew, In-Field Testing, printout from TelephonyOnline, Sep. 15, 1998.
Muhammad, Faris et al., Testing of cellular handsets poses unique challenges: moving between a 2G/2.5G network and 3G network means crossing some potentially difficult barriers. Making it seamless, the user is the goal. (Designer's Notebook), Pennwell Publishing Corp., Nov. 1, 2004.
Tanner, Rudolf et al., HSDPA helps take 3G to where it belongs, Printout from Mobilehandsetdesignline.com, Nov. 21, 2005.

* cited by examiner

*Primary Examiner*—Michael B Shingleton
(74) *Attorney, Agent, or Firm*—Cesari and McKenna, LLP; Edwin H. Paul, Esq.

(57) ABSTRACT

A multi-mode RF amplifier is described having at least a higher and a lower power path coupling an input to an output. At a pre-selected output power level, the higher power path is enabled while the lower power path is disabled when more output power is required. The process is reversed when less power is needed. The present invention matches the power gain variation over temperature characteristic of each path such that, especially at the cross over point, the gain delta (the difference in power gain between the two paths) has minimal variation over temperature. Such power gain characteristic is required for meeting the test requirements, specifically the inner loop power control, for third generation (3G) cellular handsets.

18 Claims, 6 Drawing Sheets

MULTI-MODE POWER AMPLIFIER WITH LOW GAIN VARIATION OVER TEMPERATURE

The present application is related to the commonly owned U.S. Pat. No. 7,157,966 entitled, "Multi-Mode Power Amplifier." This prior application is hereby included herein by reference.

BACKGROUND OF THE INVENTION

1. Field of the Invention

The present invention relates to power amplifiers and more particularly to power amplifiers in battery powered handsets, and even more particularly to such power amplifiers exhibiting two or more power paths.

2. Background Information

Radio-frequency (RF) signals generated at a mobile handset generally are amplified, transmitted through the handset antenna and sent to a base station for distribution to receivers. Often the frequency bands of operation of the handsets are predetermined, mainly in the frequency range from 800 MHz to 2000 MHz for various mobile standards such as WCDMA (wide band code division multiple access) and CDMA (code division multiple access). The present invention, however, may find advantageous use in device operating at other frequencies and with other formats.

In general, the handset is required to transmit at a high output power level when it is farther away from a receiving base station in order to maintain a pre-determined signal strength at the base station for sufficient reception. Conversely, the closer the handset to the base station, less transmitted power would be required. The handset output power is adjusted according to the command embedded within the RF control signal transmitted from the base station to the handset.

The handset transmitted signal, and hence the RF power amplifier output signal, has to meet the FCC regulation on spectral re-growth (also known as linearity—often measured in terms of adjacent channel leakage power ratio (ACLR) which stipulates the maximum allowable interference to other frequency channels in order to minimize interference between signals). Some known mobile devices (handsets) have RF power amplifiers powered by the full battery voltage at all times. The RF power amplifies are generally designed to meet the linearity specification at maximum transmit power level (+28 dBm for WCDMA system) under such a bias condition. Statistically, power amplifiers transmits at maximum linear output power only for a small fraction of time, while most of the transmissions take place at a considerably lower power levels (10-20 dB below maximum power).

The actual output power level from the power amplifier (and hence the handset), is continuous from some −50 dBm to 28 dBm. Multi-mode power amplifiers, compared to conventional single-path amplifiers, consume less current at low power outputs. Multi-mode handset power amplifiers are commonly implemented with two power modes, High Power (HP) and Low Power (LP). The HP mode generally applies to the range from 16 dBm to 28 dBm, and the LP mode applies to power levels below 16 dBm. The present invention is directed at multi-mode power amplifiers which are implemented with two (or more) power paths whereas one path delivers power for HP mode while the other path delivers power for LP mode.

FIG. 1 illustrates a dual path power amplifier 10 with a higher power path 12 and a lower power path 14. As mentioned above, in other designs additional parallel power paths may be found. The higher power path may be used where the design requires an output power from about 16 to 28 dBm, and the lower power path may be used for power less than 16 dBm. One direct effect of the two (or more) power path design is that the characteristics associated with each path are different since the electronic components in each path are different. For example, the active transistor sizes and DC currents in each path are different due to different power handling requirement for each path. These result in different electrical and thermal responses between the two paths. More specifically, the two paths experience different gain variations over temperature, resulting in a gain mismatch between the two paths. FIG. 2 illustrates the difference in gain (gain delta) between the two paths over temperature at an output power level of 16 dBm (the cross over power between the two paths), where the effect of the change in gain delta between the higher and the lower power paths over temperature will be most apparent. The two traces are shown over a frequency range from 1920 to 1980 GHz. The gain delta between the two paths is about 2.9 dB at 25° C. and 3.9 dB at 85° C. This represents an increase in gain delta by 1 dB between the two paths when the temperature increases from 25° C. to 85° C.

It is known in the art of power amplifier design that the power gain of power transistors used in an RF amplifiers decreases with increasing operating temperature and/or the junction temperature of the transistors. Therefore, apart from a change in ambient temperature, similar gain delta response shown in FIG. 2 can also be induced by a change in the junction temperature of the power amplifier. The increase in junction temperature is usually associated with high output power operation. For example, at an output power of 28 dBm, the junction temperature of the power transistors will be increased due to higher dissipated DC power, while the junction temperature of the same power transistors will be lower at a lower output power (e.g. 16 dBm).

All 3G handsets (a designation known in the art) are subjected to an inner loop power control test which is part of a standard qualification process. The test requires the handset to adjust its output power in accordance with the control commands. A portion of the test requires the output power to ramp down in 1 dB step from maximum handset transmitting power to the minimum power level and in reverse direction as shown in FIG. 3A. The handsets are generally pre-calibrated with a software look up table whereas specified input power is mapped to a specified output power for either the ramp up or ramp down mode. A baseband controller is used to adjust the power inputs to the power amplifier. Since the power amplifier starts out at a high output power level, the junction temperatures of the higher power transistors starts out at a high temperature and then gradually decreases as the output power drops during the ramp down operation. During the ramp up portion, exacerbated by the cross over from the lower power path to the higher power path at 16 dBm, the higher power output transistors start out with lower junction temperatures. The net result is a non-symmetrical response illustrated in FIG. 3B where item 30 shows a step higher than 1 dB. That higher step is directly related to the gain delta 20 mismatch over temperature shown in FIG. 2 that is due to the different junction temperatures in the transistor amplifiers present in the two paths. The gain change is approximately equal to the gain delta of FIG. 2, depending on the actual junction temperature at the time of the switching between the lower and the higher power paths. The present invention provides an improved power amplifier characteristic with respect to the gain delta of FIG. 2.

Some prior art conventional RF power amplifier designs have only a single power path using the same transistors over the entire output power range. In such an instance, there will be no temperature induced gain delta due to mismatch in junction temperatures, as found in an amplifier with two paths. The single power path operation avoids the switching from a power transistor at higher junction temperature to another power transistor at lower junction temperature.

The present invention is directed at reducing the mismatch in gain variation over temperature for the intrinsic amplifiers in each of the multiple power paths.

SUMMARY OF THE INVENTION

The present invention provides a multi-mode RF power amplifier that addresses the limitations in the prior art and provides advantages with respect to the prior art. In one embodiment, the inventive multi-mode amplifier includes two paths both suitable for delivering RF power to an output. A first path includes, in order, a driver amplifier and a higher power amplifier delivering power to the output. The second path includes the driver amplifier and a lower power amplifier in parallel with the higher power amplifier. The lower power amplifier also delivers power to the output. Impedance matching networks are not shown but may often be implemented throughout the multi-mode power amplifier.

As mentioned before, in the multi-mode power amplifier there are at least two operating modes: a high power mode and a low power mode. A logic signal from the handset baseband controller selects one of the two modes depending on the handset output power levels.

In one illustrative embodiment, separate bias circuits provide DC collector currents to each of the driver, higher power and lower power amplifiers. Bias circuits are designed as mirror circuits. As known to those skilled in the art, mirror circuits may be proportional, one current being mirrored with another current that is proportionally larger or smaller. For the higher power amplifier, the bias circuit provides a DC collector current that increases with rising temperature, while the bias circuit for the lower power amplifier provides a DC collector current that decreases with increasing temperature. It is known that the power gain of an amplifier is proportional to the DC collector current density of the power transistors used. Increasing the DC collector currents will increase the DC current density and so the power gain of the power transistors, and vice versa. As mentioned above, it is also known that the power gain of the power transistors decreases with increasing operating and/or the junction temperatures. Therefore, the increase in DC collector current at rising temperature slightly increases the power gain of the higher power amplifier compensating somewhat for the loss of power gain due to rising temperature, while the decrease in DC collector current at rising temperature decreases the power gain of the lower power amplifier adding to the loss of power gain due to rising temperatures. As a result, the gain variation (loss) over temperature for the higher power path is reduced, while the gain variation (loss) over temperature for the lower power path is increased. The net effect is that the gain variation over temperature for the higher and lower power paths is matched so that, when switching from one path to the other path, the gain delta between the paths is about equal over the temperature range of interest.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

The present invention provides a matching or balancing of gain variations over temperature in a multi-mode RF amplifier having two or more power paths. A bias technique reduces the gain variation in the higher power path while increasing the gain variation in the lower power path over temperature. The invention illustratively balances the gain variation mismatch preferably at the power level where switching takes place from one path to the other path.

Figure 4:
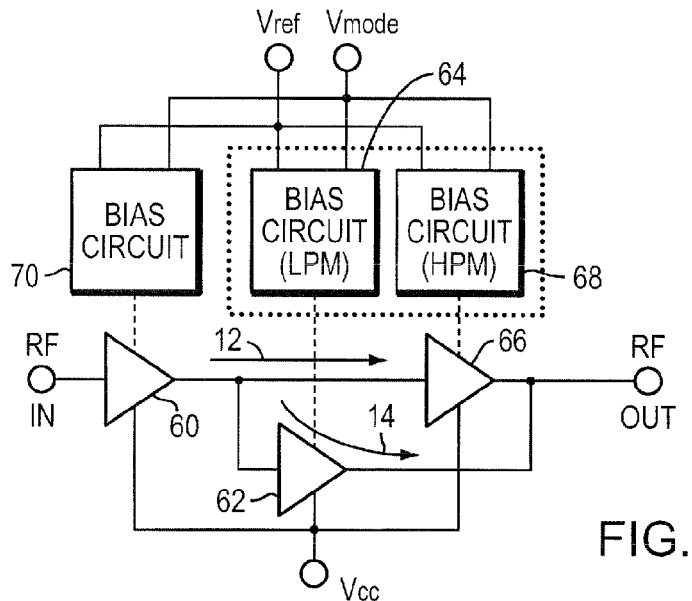
FIG. 4 is a schematic block diagram of a multi-power mode amplifier incorporating an example of the present invention.

FIG. 4 is a schematic block diagram of an illustrative circuit embodiment of the present invention. The approach is to reduce the gain drop for the higher power path at 85° C., while increasing the gain drop of the lower power path at 85° C.

In FIG. 4 a bias circuit 64 controls the DC collector current of the amplifier 62 in the lower power path 14, and bias circuit 68 controls the DC collector current of the amplifier 66 in the higher power path. As discussed above, it is known to those skilled in the art that the power gain of an RF (radio Frequency) HBT (heterojunction bipolar transistor) can be increased by increasing the DC collector current density, and, correspondingly, the power gain decreases with decreasing the DC collector current density. The transistors used in the multi-mode amplifier are preferably HBTs, but other types may be used in some applications. All the transistors described below are preferable HBTs unless specifically described as different. In accordance with this characteristic, the bias circuit 68 for the higher power amplifier 66 increases the DC collector current with higher temperatures to decrease the gain drop for the higher power path amplifier 66. Correspondingly, the bias circuit 64 reduces the DC collector current with higher temperatures to increase the gain drop for the lower power path amplifier 62. This approach balances the gain drops at higher temperatures so that the variation of the differential or gain delta between the two paths over temperature will be reduced.

Figure 5:
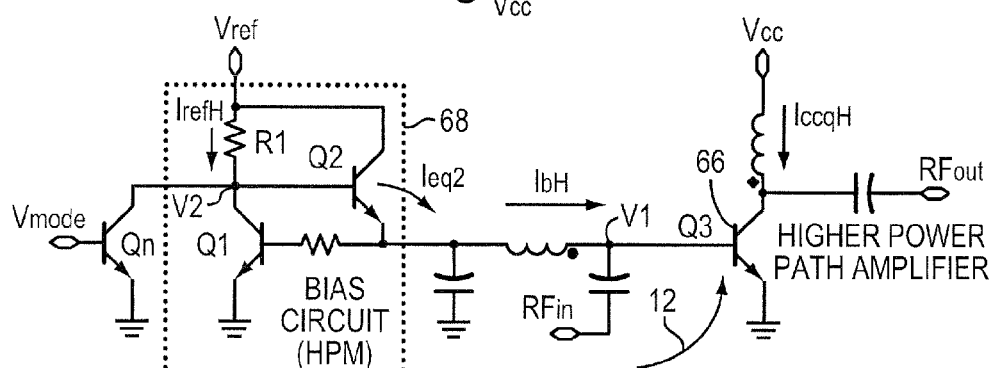
FIG. 5 is a schematic of a circuit illustrating a bias circuit mirror for the higher power amplifier of FIG. 4.
Figure 6:
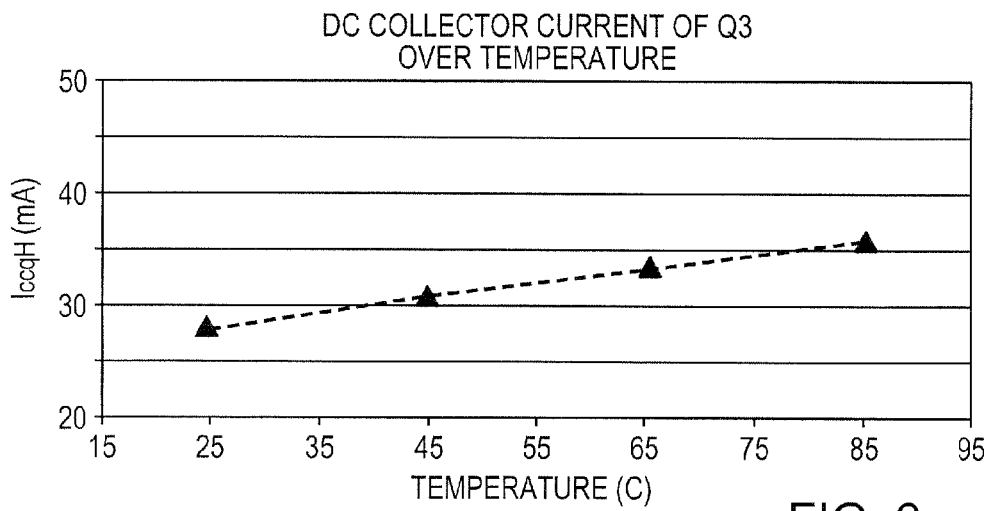
FIG. 6 is a trace showing the increase in DC collector current over temperature for the higher power amplifier of FIG. 4.

FIG. 5 is an illustrative circuit 68 for the bias circuit for the higher power path amplifier 66. The higher power path amplifier is Q3, and bias circuit 68 comprises R1, Q1 and Q2. As the temperature increases, the DC current gain and the base-emitter turn-on voltages for Q1, Q2 and Q3 decrease. The lower base-emitter voltage increases the voltage drop across R1 that increase the current IrefH. This, in turn, raises the base current of Q1, Q2 and Q3. The DC collector current of Q3, IccqH, is equal to the base current of Q3, IbH, times the DC current gain of Q3. The bias circuit 68 is designed such that the rate of increase in IbH over temperature is higher than the rate of decrease in the DC current gain of Q3, resulting in higher IccqH at high temperature. The increase in the DC collector current (IccqH) density of Q3 compensates some of the gain drop of the higher power path amplifier Q3 due to the higher operating temperature. Similar gain compensation is expected with an increase in the junction temperature of Q3. FIG. 6 is a trace illustrating the increase in IccqH of the higher power path amplifier 66 over temperature due to the bias circuit 68.

Figure 7:
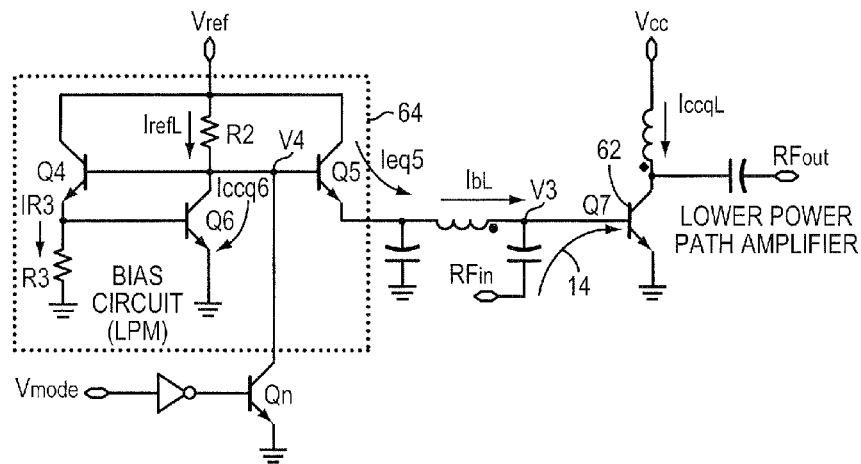
FIG. 7 is a schematic of a circuit illustrating a bias circuit mirror for the lower power amplifier of FIG. 4.

FIG. 7 is a schematic of an illustrative bias circuit 64 biasing the lower power path amplifier 62. The lower power path amplifier is Q7, and the bias circuit comprises R2, R3, Q4, Q5 and Q6. As discussed for FIG. 5, IrefL increases when the temperature increases due to the drop in the base-emitter voltages across Q4, Q5, Q6 and Q7. However, the bias circuitry 64 for the lower power path amplifier 62 is designed to operate at a very low IrefL (illustratively a factor of four lower) than the IrefL of the bias circuit 68 of the higher power path amplifier 66 at 25° C., assuming the bias circuits output the same DC collector current. The DC collector current of Q7, IccqL, is equal to the base current of Q7, IbL, times the DC current gain of Q7. Despite that IrefL still increases with temperature, the rate of increase in IbL is lower than the rate of decrease in DC current gain of Q7, resulting in lower IccqL at higher temperatures. The lower rate of increase in IbL is inversely proportional to R2 compared to the rate of increase for IbH in the higher power path which is inversely proportional to R1. The lower IccqL at higher temperature further increases the gain drop (lowers the gain due to lower collector current density) of the lower power path amplifier Q7 in addition to the gain drop due to the higher operating temperature (as discussed before). The overall result is a larger gain drop for the lower power path with temperature, resulting from the higher gain drop at 85° C. for the lower power path amplifier.

With reference to FIGS. 5 and 7, a concrete example follows to further illustrates the present invention. In this example the collector current, IccqH and IccqL at 25° C. are chosen to be the same at 30.0 mA. The same current is selected so that the effects of the bias circuits can be directly compared to each other. In practice the collector current IccqH will be three or more times greater than IccqL.

EXAMPLE 1

In FIG. 5, R1 is 330 ohms and Vref is 2.85V, the following applies:

| TEMP | V1 | V2 | IrefH | Ieq2 | IbH | IccqH |
|---|---|---|---|---|---|---|
| 25° C. | 1.25 V | 2.45 V | 1.25 mA | 170 uA | 166 uA | 30.0 mA |
| 85° C. | 1.19 V | 2.32 V | 1.66 mA | 360 uA | 348 uA | 39.5 mA |

EXAMPLE 2

In FIG. 7, R2 is 1.1 Kohm, R3 is 2 kohm and Vref is 2.85V, the following applies:

| TEMP | V3 | V4 | IrefL | Ieq5 | IR3 | Iccq6 | IbL | IccqL |
|---|---|---|---|---|---|---|---|---|
| 25° C. | 1.25 V | 2.45 V | 365 uA | 166 uA | 609 uA | 360 uA | 166 uA | 30 mA |
| 85° C. | 1.17 V | 2.29 V | 508 uA | 240 uA | 511 uA | 500 uA | 240 uA | 24.6 mA |

The above tables demonstrate that the output DC collector current for the higher power amplifier, IccqH, of FIG. 5 increases when temperature is raised, while the corresponding current for the lower power amplifier, IccqL, decreases when temperature is raised. Please note that the base current to the output transistor in each case rises with temperature, but that the rise in IbL is much reduced compared to the increase in IbH. In this instance the loss of DC current gain for Q7 with rising temperature dominates the increase in base current, IbL, resulting in a reduction in IccqL with temperature.

There are several approaches and alternatives to explaining the temperature response of the circuit in FIG. 5 compared to that in FIG. 7. Perhaps the best is to point out that the addition of Q4 and R3 diverts some of the IrefL away from the stacked emitter followers Q5 and Q7, and the collector of Q6. One alternative approach recognizes that IrefL is much reduced compared to IrefH, and that the bias circuit for FIG. 7 will not operate on the portion of IrefL that is diverted away from collector of Q6.

However explained, the result is that by lowering the IrefL and diverting some of IrefL away from Q5 and Q7, the increase in IrefL with rising temperature is insufficient to overcome the loss of DC current gain of Q7, and IccqL is thus reduced.

The Vmode signal found in FIGS. 5 and 7, as mentioned before, enables either the higher power path or the lower power path. Vmode is generated by the handset baseband controller depending on the output power requirement, as known in the art.

Figure 8:
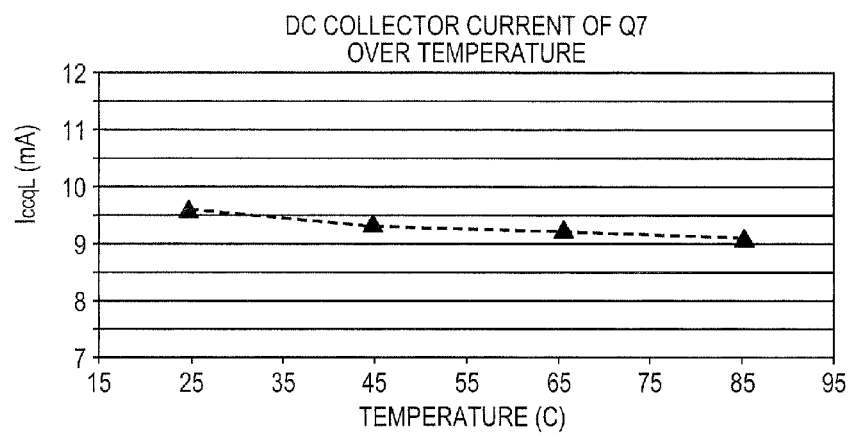
FIG. 8 is a trace showing the decrease in DC collector current over temperature for the lower power amplifier of FIG. 4.

FIG. 8 illustrates the drop in the DC collector current, IccqL, of the lower power path transistor, Q7, as temperature rises. The lower DC collector current for Q7 causes a larger gain drop for the lower power path amplifier, Q7, at 85° C.

Figure 9:
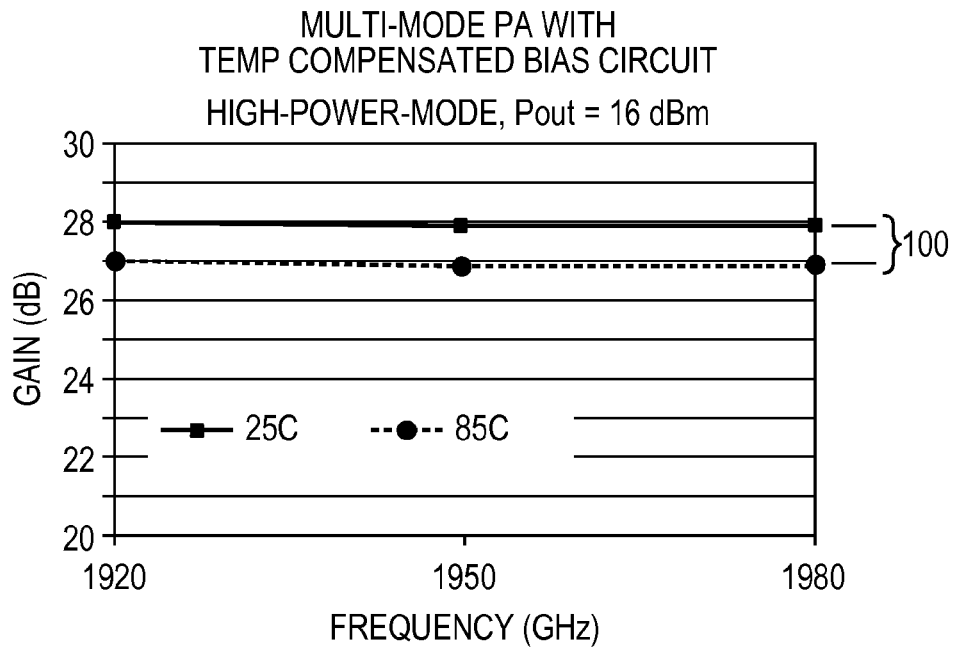
FIGS. 9 and 10 are traces of gain variation over temperature at 16 dBm for each of the two power paths of FIG. 4 over the frequency range of interest.
Figure 10:
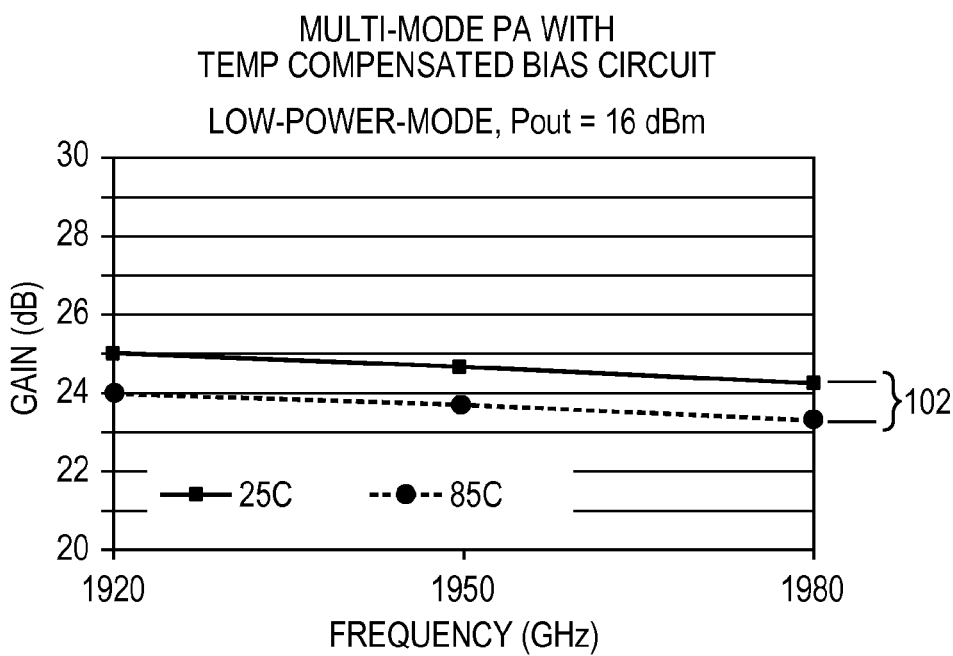

FIGS. 9 and 10, illustrate the net effects of the temperature sensitive bias circuits for the higher and the lower power path amplifiers. The gain drop 100 from 25° C. to 85° C. in the higher power path (FIG. 9) is closely matched with the gain drop 102 from 25° C. to 85° C. in the lower power path (FIG. 10) over the frequencies of interest. Again, the comparisons are at 16 dBm where the power amplifier switches from one power mode to the other. As mentioned before, the temperature effects will be most noticeable at this point.

Figure 1:
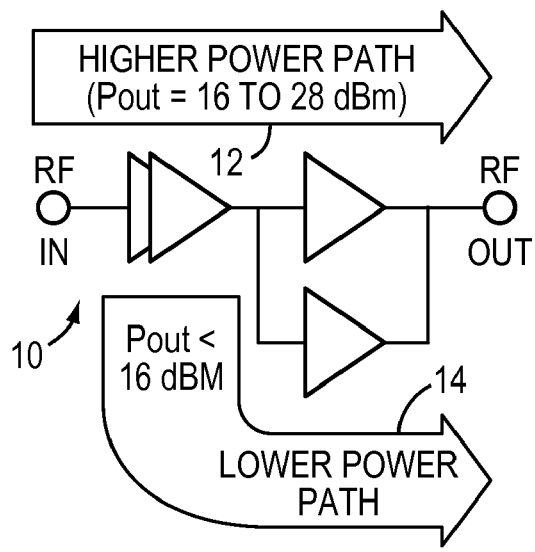
FIG. 1 is a schematic block diagram illustrating a dual power path multi-mode power amplifier.
Figure 2:
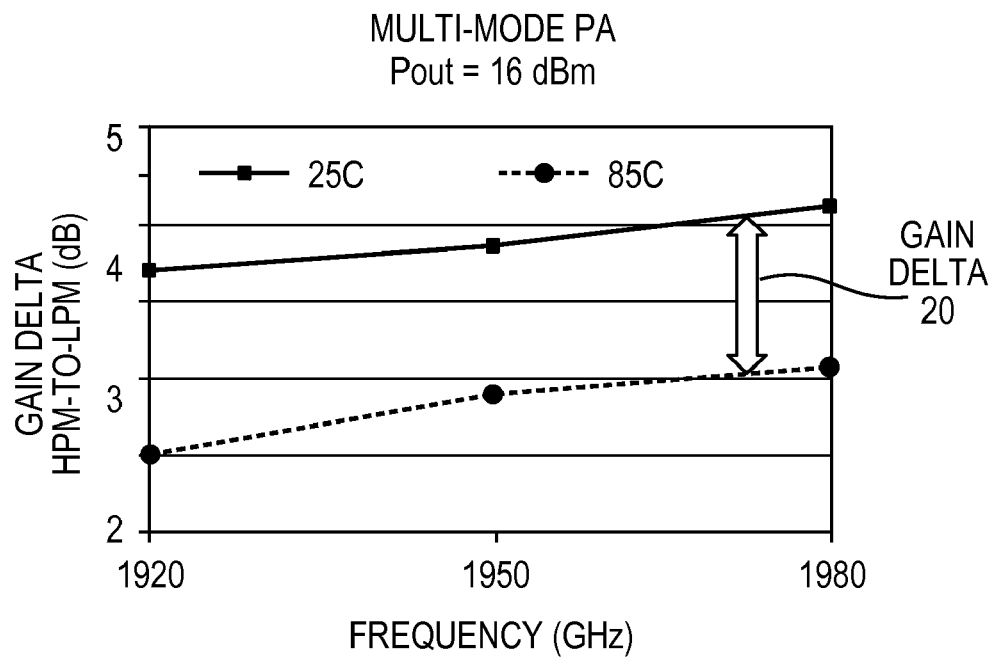
FIG. 2 are traces showing the gain delta between the two power paths of FIG. 1 at 16 dBm at 25° C. to 85° C. over the frequency range of interest.
Figure 3A:
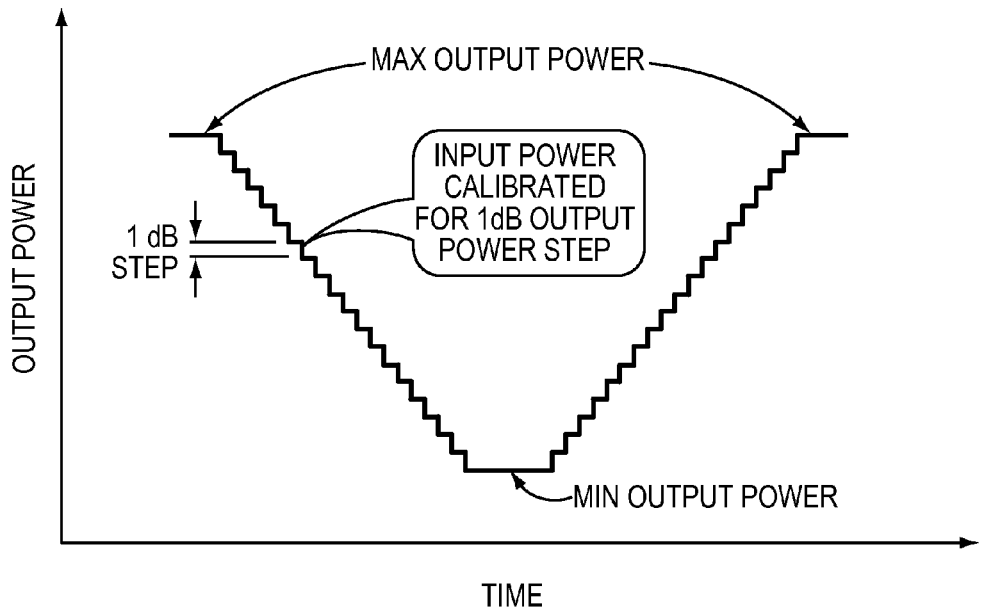
FIG. 3A is a trace of a typical 3G handset inner loop power control test in 1 dB output power steps.
Figure 3B:
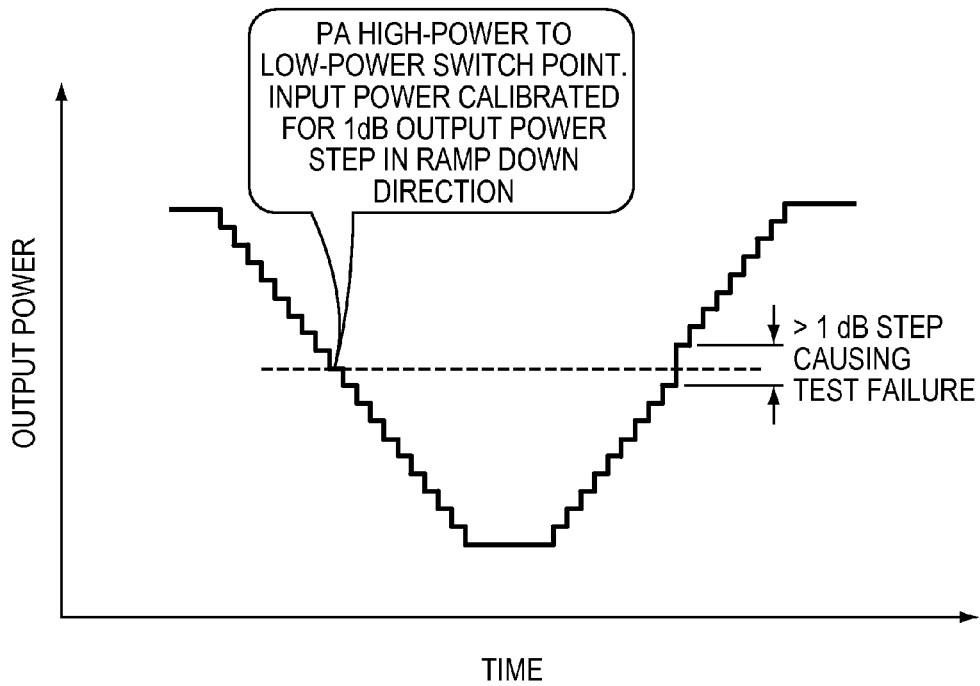
FIG. 3B is a trace of a failed 3G handset inner loop power control test using a multi-mode power amplifier with the response of FIG. 2 whereas the power amplifier's input power was calibrated for the ramp down mode only.
Figure 11:
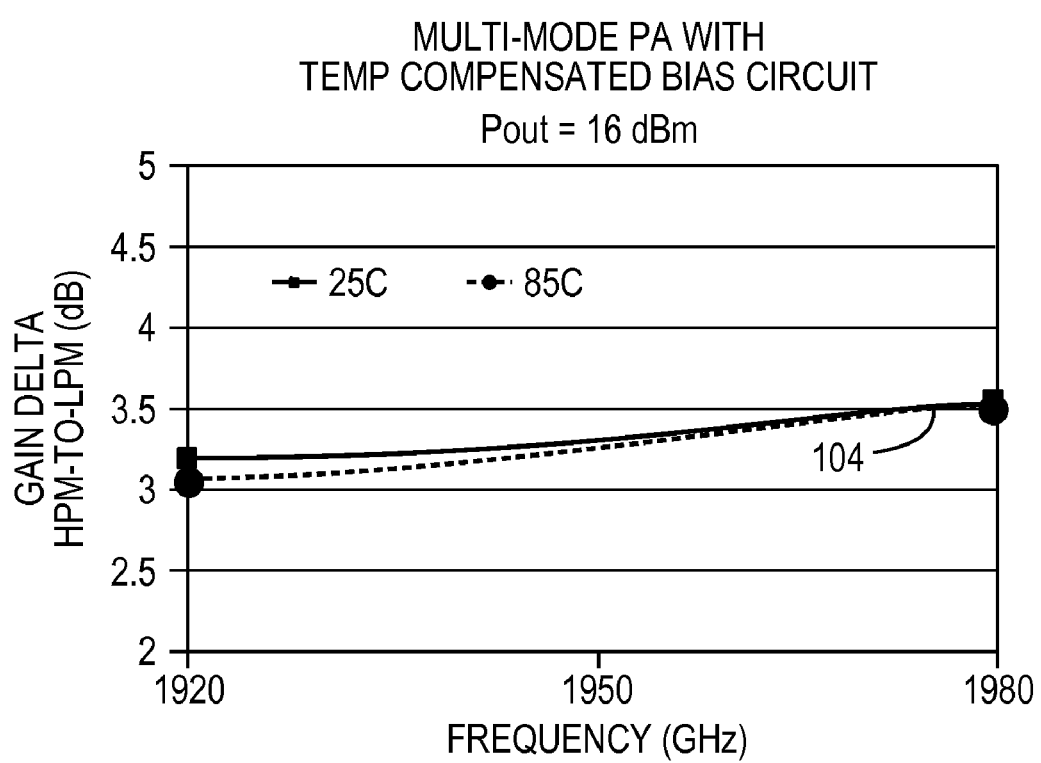
FIG. 11 are traces showing the gain delta between the two paths of FIG. 4 at 16 dBm at 25° C. and 85° C. over the frequency range of interest.

FIG. 11 illustrates the subtraction of high power and low power mode gain (100 and 102) of FIGS. 9 and 10. The result of this subtraction is referred to as a gain delta, and gain delta without the present invention is about 1.1 dB, see FIG. 2, whereas that gain delta using the present invention in FIG. 11 is less than 0.1 dB. Note again, that in the prior art single path power amplifier circuits there can be no gain delta since there is only one amplifying path.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A multi-mode amplifier defining an input and an output, the multi-mode amplifier comprising:
    a first higher power amplifier transferring the input to the output, the first higher power amplifier comprising a higher power transistor arranged to provide an increased power gain when its DC collector current is increased and a reduced power gain with rising temperature;
    a first bias circuit configured to provide a first base current to the higher power transistor, wherein the first base current increases when temperature increases, wherein the rate of increase in the first base current is higher than the rate of decrease in DC current gain of the higher power transistor with rising temperature and, hence, increases the DC collector current of the higher power transistor at higher temperatures, but wherein the result is a decrease in power gain with rising temperature;
    a second lower power amplifier in parallel with the first higher power amplifier, the second lower power amplifier comprising a lower power transistor arranged to provide a reduced power gain when its DC collector current is decreased and a reduced power gain with rising temperature; and
    a second bias circuit configured to provide a second base current to the lower power transistor, wherein, although the second base current increases with rising temperature, the rate of increase in the second base current is lower than the rate of decrease in DC current gain of the lower power transistor with rising temperature and, hence, decreases the DC collector current of the lower power transistor at higher temperatures, wherein the result is a decrease in power gain with rising temperature, and wherein the magnitude of decrease in power gain of the higher power amplifier approximately matches the magnitude of decrease in power gain of the lower power amplifier when the temperature rises.

2. The multi-mode amplifier of claim 1 wherein the first bias circuit includes a first reference current that mirrors the DC collector current of the higher power transistor and the second bias circuit includes a second reference current that mirrors the DC collector current of the lower power transistor.

3. The multi-mode amplifier of claim 2 wherein the second reference current is at least four times lower than the first reference current, and wherein the rate of increase in the second reference current available for mirroring with rising temperature is lower than the first reference current.

4. The multi-mode amplifier of claim 3 further comprising an emitter follower transistor that diverts some of the second reference current wherein it is not mirrored in the lower power transistor DC collector current.

5. The multi-mode amplifier of claim 1 wherein the first bias circuit includes:
    a first bias transistor with its base coupled to the base of the higher power transistor and the emitters coupled together to ground such that the first bias transistor forms a current mirror with the higher power transistor;
    a first resistor coupled from the collector of the first bias transistor to a power supply, wherein the base emitter junctions voltage drops of the first bias and the higher power transistor decrease with increasing temperature, wherein the base emitter junction voltages drop of the first bias circuit and the higher power transistor decrease with increasing temperature, wherein the first reference current through the first resistor increases with increasing temperature, wherein the first base current of the higher power transistor increases with temperature, wherein the rate of increase in the first base current is higher than the rate of decrease in DC current gain of the higher power transistor with rising temperature and, hence, increases the DC collector current of the higher power transistor at higher temperatures; and
    a second bias transistor with its collector coupled to a power supply, its base coupled to the collector of the first bias transistor, and its emitter coupled to the common bases of the higher power and first bias transistors, wherein the base currents for both the higher power and first bias transistors are supplied by the emitter of the second bias transistor.

6. The multi-mode amplifier of claim 1 wherein the second bias circuit includes:
    a third bias transistor with its emitter coupled to the base of the lower power transistor;
    a fourth bias transistor with its collector coupled to a power supply, its base connected to the base of the third bias transistor and its emitter connected to a second resistor to ground;
    a fifth bias transistor with its collector connected to the bases of the third and the fourth bias transistors, its base is connected to the emitter of the fourth bias transistor and its emitter is connected to ground;
    a third resistor coupled from the collector of the fifth bias transistor to a power supply;
    wherein the second and third resistors are selected such that a second reference current through the third resistor is a mirror of the DC collector current of the lower power transistor; and
    wherein the base emitter junction voltages drop of the third, fourth, and fifth bias transistors and the lower power transistor decrease with increasing temperature, wherein the second reference current through the third resistor increases with increasing temperature, wherein the second base current of the lower power transistor increases with temperature, wherein the rate of increase in the second base current is lower than the rate of decrease in DC current gain of the lower power transistor with rising temperature and, hence, decreases the DC collector current of the lower power transistor at higher temperatures.

7. A method for amplifying a signal traveling through a multi-mode amplifier from an input to an output, the method comprising the steps of:
    first transferring the input to the output via a higher power transistor, wherein when temperature increases the power gain of the higher power transistor decreases;
    increasing the DC collector current of the higher power transistor as the temperature rises, partially compensating for the decrease in power gain with rising temperature;

second transferring, in parallel with the first transferring, the input to the output via a lower power transistor, wherein when the temperature increases the power gain of the lower power transistor decreases; and decreasing the DC collector current of the lower power transistor as the temperature rises, further decreasing the power gain of the lower power transistor, wherein the magnitude of decrease in power gain of the higher power transistors (approximately) matches the magnitude of decrease in power gain of the lower power transistor.

8. The method of claim 7 wherein the step of increasing the DC collector current of the higher power transistor includes a step of first mirroring the DC collector current of the higher power transistor and increasing the first reference current that mirrors the higher power transistor's DC collector current.

9. The method of claim 7 further wherein the step of decreasing the DC collector current of the lower power transistor includes a step of second mirroring the DC collector current of the lower power transistor and increasing the second reference current that mirrors the lower power transistor's DC collector current, and wherein the second reference current is at least four time lower than the first reference current.

10. A multi-mode amplifier comprising:
means for first transferring the input to the output via a higher power transistor, wherein the power gain of the higher power transistor decreases with rising temperature;
means for increasing the power gain of the higher power transistor by increasing the DC collector current of the higher power transistor when the temperature rises, partially compensating for the decrease in power gain with rising temperature;
means for second transferring, in parallel with the first transferring, the input to the output via a lower power transistor; and
means for decreasing the power gain of the lower power transistor by decreasing the DC collector current of the lower power transistor with rising temperature, wherein the magnitude of decrease in power gain of the higher power transistor (approximately) matches the magnitude of decrease in power gain of the lower power transistor with rising temperature.

11. The multi-mode amplifier of claim 10 wherein the means for increasing the DC collector current of the higher power transistor includes:
means for mirroring the DC collector current of the higher power transistor; and
means for increasing a first reference current.

12. The multi-mode amplifier of claim 10 wherein the means for decreasing the DC collector current of the lower power transistor includes:
means for mirroring the DC collector current of the lower power transistor; and
means for increasing a second reference current.

13. The multi-mode amplifier of claim 10 further wherein the means for mirroring includes:
means for creating a voltage drop across a first resistor with the first reference current, wherein the voltage drop increases with temperature that increases the first reference current and thereby increases the DC collector current of the higher power transistor.

14. A multi-mode amplifier defining an input and an output, the amplifier comprising:

a higher power path comprising a higher power transistor and a first bias circuit providing and controlling DC collector current of the higher power transistor;
a lower power path comprising a lower power transistor and a second bias circuit providing and controlling DC collector current of the lower power transistor; and
wherein the first bias circuit provides that the DC collector current of the higher power transistor increases with temperature, and wherein the second bias circuit provides that the DC collector current of the lower power transistor decreases with temperature, wherein the higher power path exhibits a reduced power gain variation with temperature, and the lower power path exhibits an increased power gain variation with temperature that matches the power gain variation with temperature of the higher power transistor.

15. The multi-mode amplifier of claim 14 wherein the first bias circuit has a mirror circuit that controls the DC collector current of the higher power transistor, and the second bias circuit has a mirror circuit that controls the DC collector current of the lower power transistor.

16. The multi-mode amplifier of claim 14 wherein the higher and lower power transistors comprise Heterojunction Bipolar Transistors (HBTs).

17. The multi-mode amplifier of claim 14 wherein the first bias circuit provides a first base current to the higher power transistor that increases with rising temperature, and the second bias circuit provides a second base current to the lower power transistor that increases with rising temperature.

18. A multi-mode power amplifier having an input and an output, the muulti-mode amplifier comprising:
a first higher power amplifier transferring the input to the output, the first higher power amplifier comprising a higher power transistor arranged to provide an increased power gain when its DC collector current is increased and a reduced power gain with rising temperature;
a first reference current arranged in a first bias circuit configured to provide a first base current to the higher power transistor, wherein the DC collector current of the higher power transistor is a mirror of the first reference current, and wherein the DC collector current of the higher power transistor rises at higher temperatures, but wherein the result is a decrease in power gain with rising temperature;
a second lower power amplifier in parallel with the first higher power amplifier, the second lower power amplifier comprising a lower power transistor arranged to provide a reduced power gain when its DC collector current is decreased and a reduced power gain with rising temperature; and
a second reference current arranged in a second bias circuit configured to provide a second base current to the lower power transistor, wherein the DC collector current of the lower power transistor is a mirror of the second reference current, and wherein second reference current is at least four times lower than the first reference current such that the DC collector current of the lower power transistor decreases with rising temperatures, and wherein the result is a decrease in power gain with rising temperature, and wherein the magnitude of decrease in power gain of the higher power amplifier approximately matches the magnitude of decrease in power gain of the lower power amplifier when the temperature rises.

* * * * *